United States Patent
Yoon et al.

(10) Patent No.: US 7,701,267 B2
(45) Date of Patent: Apr. 20, 2010

(54) SEMICONDUCTOR DEVICE INCLUDING PHASE DETECTOR

(75) Inventors: Dae-Kun Yoon, Gyeonggi-do (KR);
Dae-Han Kwon, Gyeonggi-do (KR);
Chang-Kyu Choi, Gyeonggi-do (KR);
Jun-Woo Lee, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 12/164,758

(22) Filed: Jun. 30, 2008

(65) Prior Publication Data

US 2009/0278577 A1     Nov. 12, 2009

(30) Foreign Application Priority Data

May 6, 2008   (KR) .................. 10-2008-0041663

(51) Int. Cl.
*H03L 7/06* (2006.01)
(52) U.S. Cl. .................. 327/147; 327/141; 327/172
(58) Field of Classification Search .............. 327/2, 327/3, 7, 8, 141, 144–147, 151, 156–157, 327/172, 175; 331/18–19, 25, 34; 375/373–376
See application file for complete search history.

(56) References Cited

U.S. PATENT DOCUMENTS 5,418,822 A * 5/1995 Schlachter et al. .......... 375/354
6,949,958 B2 * 9/2005 Zerbe et al. .................. 327/3
7,259,604 B2 * 8/2007 Gomm ....................... 327/175

FOREIGN PATENT DOCUMENTS

| JP | 2001-111394 | 4/2001 |
|---|---|---|
| KR | 10-0333648 B1 | 4/2002 |
| KR | 1020030000605 A | 1/2003 |
| KR | 1020080001861 A | 1/2008 |

OTHER PUBLICATIONS

Notice of Allowance issued from Korean Intellectual Property Office on Sep. 8, 2009.

* cited by examiner

*Primary Examiner*—Long Nguyen
*Assistant Examiner*—Shikha Goyal
(74) *Attorney, Agent, or Firm*—IP&T Law Firm PLC

(57) ABSTRACT

A semiconductor device including an edge synchronizer which outputs a synchronized strobe signal generated by synchronizing a transition time point of a strobe signal with clock edges of a main clock or a sub clock, a detector which outputs a phase determination signal indicating a phase difference between the main clock and the sub clock in response to the synchronized strobe signal, and a duty ratio corrector which adjusts a duty ratio of the main clock and the sub clock in response to the phase determination signal.

13 Claims, 7 Drawing Sheets

< FIRST CASE >

< SECOND CASE >

< FIRST CASE >

< SECOND CASE >

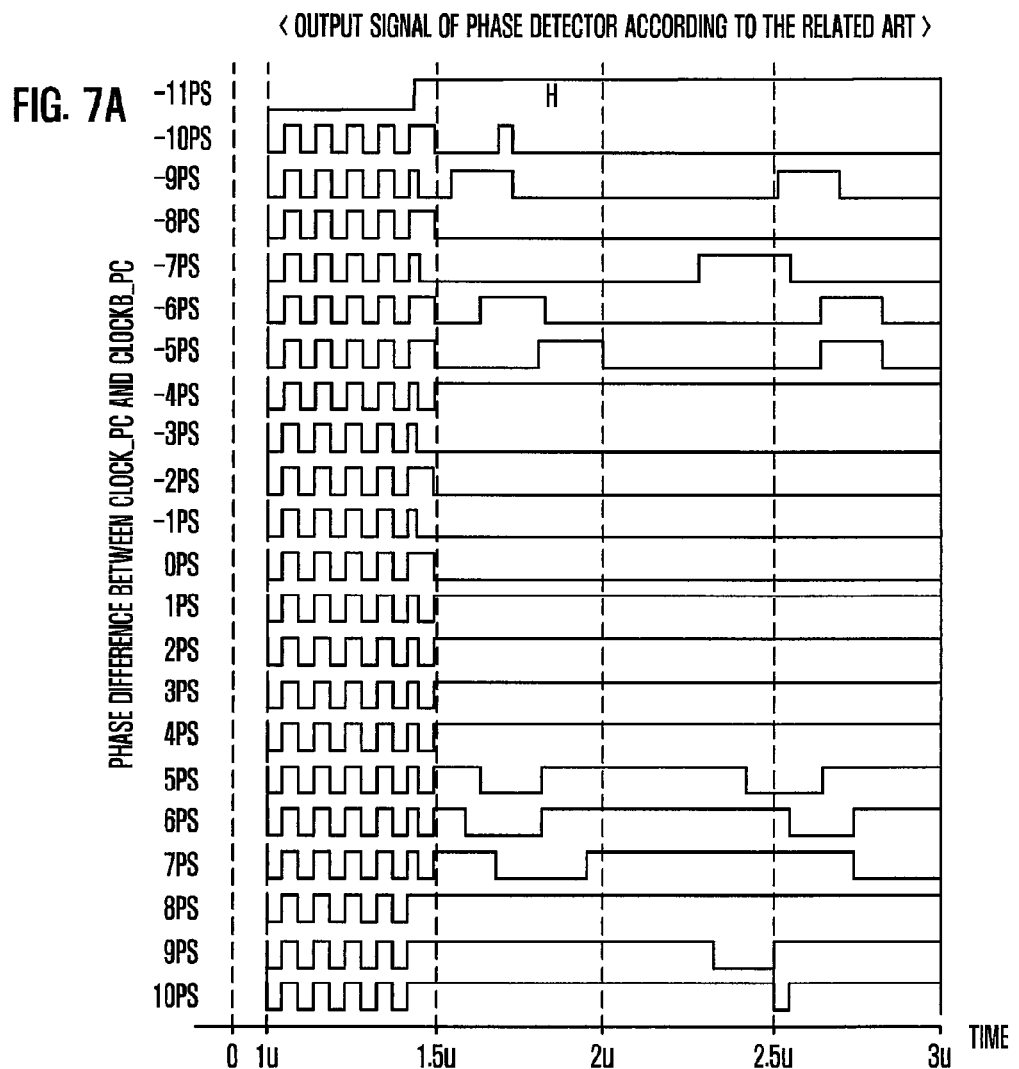
FIG. 7A  ⟨ OUTPUT SIGNAL OF PHASE DETECTOR ACCORDING TO THE RELATED ART ⟩
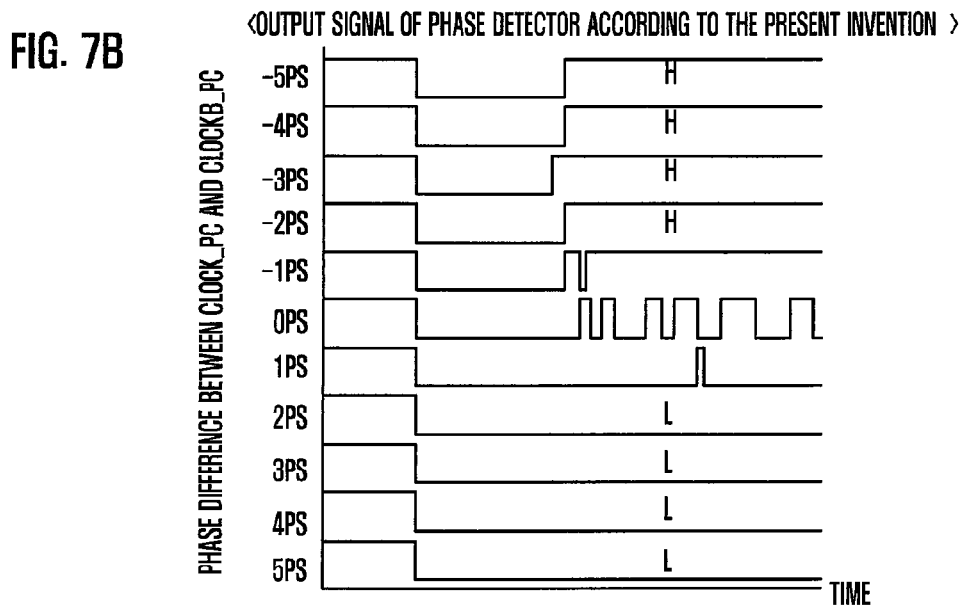
FIG. 7B  ⟨OUTPUT SIGNAL OF PHASE DETECTOR ACCORDING TO THE PRESENT INVENTION ⟩

SEMICONDUCTOR DEVICE INCLUDING PHASE DETECTOR

CROSS-REFERENCE(S) TO RELATED APPLICATIONS

This application claims priority of Korean patent application number 10-2008-0041663, filed on May 6, 2008, which is incorporated by reference in its entirety.

BACKGROUND OF THE INVENTION

The subject matter relates to a semiconductor design technology, and more particularly, to a phase detector circuit. Especially, the subject matter relates to a phase detector circuit of a semiconductor device, said circuit having an improved phase detection ability through a phase detection operation synchronized with an external clock In general, a synchronous semiconductor memory device such as a Double Data Rate Synchronous DRAM (DDR SDRAM) includes a phase detector circuit for detecting a phase difference between clocks although the clocks have different frequencies or the same frequencies.

FIG. 1 is a diagram showing a conventional phase correction circuit according to the related art.

Referring to FIG. 1, the conventional phase correction circuit includes a phase detector 100 for detecting a phase difference between a main clock CLOCK_PC and a sub clock CLOCKB_PC in response to a strobe signal STROBE, and a duty ratio corrector 120 for correcting a duty ratio of the main clock CLOCK_PC and the sub clock (CLOCKB_PC) in response to output signals UP/DOWN_SIG and VALID_STROBE of the phase detector 100. The phase correction circuit according to the related art further includes a phase correction operation controller 140 for controlling a phase correction operation by generating an enable signal ENABLE to control On/Off the operation of the duty ratio corrector 120 and phase detector 100.

The duty ratio corrector 120 includes a code counter 122 for increasing or decreasing a duty correction code DUTY_CORRECTION_CODE in response to the output signals UP/DOWN_SIG and VALID_STROBE of the phase detector 100, and a phase controller 124 for controlling phases of a main clock CLOCK_PC and a sub clock CLOCKB_PC in response to the duty correction code DUTY_CORRECTION_CODE.

Hereinafter, operation of the conventional phase correction circuit will be described based on the above described structure.

When the phase correction operation controller 140 activates the enable signal ENABLE, the phase controller 100 and the duty ratio corrector 120 are enabled to perform their respective operations.

In this condition, if the phase correction operation controller 140 starts to toggle a strobe signal STROBE at a regular interval, the phase detector 100 accordingly starts detecting a phase difference between a main clock CLOCK_PC and a sub clock CLOCKB_PC.

The phase detector 100 outputs an activated phase detection signal UP/DOWN_SIG if the phase of the sub clock CLOCKB_PC is larger than that of the main clock CLOCK_PC. Alternatively, the phase detector 100 outputs a deactivated phase detection signal UP/DOWN_SIG if a phase of the main clock CLOCK_PC is larger than that of the sub clock CLOCKB_PC.

At the same time, the phase detector 100 outputs activate or inactivate valid detection signal VALID_STROBE. Here, the valid detection signal VALID_STROBE indicates whether the phase detection signal UP/DOWN_SIG outputted from the phase detector 100 is valid or invalid.

The phase detector 100 performs a phase detection operation in response to a strobe signal STROBE toggled at a regular interval. That is, the phase detector 100 performs a phase detection operation and outputs the phase detection signal UP/DOWN_SIG whenever a strobe signal STROBE is toggled. However, the phase detector 100 cannot detect an accurate phase difference of the main clock CLOCK_PC and the sub clock CLOCKB_PC by one time toggling of the strobe signal STROBE. That is, an accurate phase difference between the main clock CLOCK_PC and the sub clock CLOCKB_PC can be detected by repeating the phase detection operation by toggling the strobe signal STROBE several times. Accordingly, if the duty ratio corrector 120 were to use phase detection signal UP/DOWN_SIG whenever the strobe signal STROBE was toggled, it would not perform an accurate phase correction operation. Instead, accurate phase correction operation is performed by having the duty ratio corrector 120 uses the phase detection signal UP/DOWN_SIG when the valid detection signal VALID_STROBE is active.

The coding counter 122, included in the duty ratio corrector 120, increases or decreases a duty correction code DUTY_CORRECT_CODE in response to a phase detection signal UP/DOWN_SIG applied when the valid detection signal VALID_STROBE is active.

For example, if the phase detection signal UP/DOWN_SIG is active when the valid detection signal VALID_STROBE is in an active state, this indicates that a detected phase of a sub clock CLOCKB_PC is greater than the phase of the main clock CLOCK_PC. In response, the coding counter 122 increases and outputs the duty correction code DUTY_CORRECT_CODE. If the phase detection signal UP/DOWN_SIG is inactive, the detected phase of the main clock CLOCK_PC is less than the phase of the sub clock CLOCKB_PC. In response, the coding counter 122 decreases and outputs the duty correction code DUTY_CORRECT_CODE.

A predetermined initial value for the duty correction code DUTY_CORRECT_CODE is defined in advance.

The phase controller 124, included in the duty ratio controller 120, drives an external main clock CLOCK and an external sub clock CLOCKB with a driving power corresponding to the duty correction code DUTY_CORRECT_CODE and outputs them as the main clock CLOCK_PC and the sub clock CLOCKB_PC.

For example, if the value of the duty correction code DUTY_CORRECT_CODE is comparatively large, the external main clock CLOCK is driven stronger than the external sub clock CLOCKB and outputted as the main clock CLOCK_PC and the sub clock CLOCKB_PC. If the value of the duty correction code DUTY_CORRECT_CODE is comparatively small, the external sub clock CLOCKB is driven stronger than the external main clock CLOCK and outputted as the main clock CLOCK_PC and the sub clock CLOCKB_PC.

Although the main clock CLOCK_PC and the sub clock CLOCKB_PC output by the duty ratio corrector 120 may also be input and used in an internal circuit of a semiconductor device using the main clock CLOCK_PC and the sub clock CLOCKB_PC, the main clock CLOCK_PC and the sub clock CLOCKB_PC are inputted to the phase detector 100 and used for performing a phase correction operation.

The phase difference between the external main clock CLOCK and the external sub clock CLOCKB is not accurately corrected through only one phase correction operation. The main clock CLOCK_PC and the sub clock CLOCKB_PC with the phase difference accurately corrected are output through repetition of the phase correction operations.

FIG. 2 is a circuit diagram showing a phase detector 100 included in the conventional phase correction circuit of FIG. 1.

Referring to FIG. 2, the phase detector 100 includes a first voltage output unit 102 for outputting a first voltage OUTB having a potential level varying corresponding to a duty ratio of a main clock CLOCK_PC, a second voltage output unit 104 for outputting a second voltage OUT having a potential level varying corresponding to a duty ratio of a sub clock CLOCKB_PC, and a potential level comparator 106 for comparing the potential levels of the first voltage OUTB and the second voltage OUT and generating a phase detection signal UP/DOWN_SIG and a valid detection signal VALID_STROBE according to the result thereof.

Hereinafter, the operation of the phase detector 100, included in the conventional the phase correction circuit, will be described based on the above described structure thereof.

The operation of the first voltage output unit 102 and the second voltage output unit 104 may be divided into a 'charge operation period' and a 'discharge operation period' according to a strobe signal STROBE.

That is, the potential levels of the first voltage OUTB and the second voltage OUT increase because first and second strobe PMOS transistor ST_P1 and ST_P2 are turned on and a strobe NMOS transistor ST_N is turned off when the strobe signal STROBE is inactive, at a logical low. Here, the first and second strobe PMOS transistors ST_P1 and ST_P2 respectively control applying power to an output end OUT_ND1 of the first voltage output unit 102 and an output end OUT_ND2 of the second voltage output unit 104. The strobe NMOS transistor ST_N directly controls power discharge. That is, since the first voltage output unit 102 and the second voltage output unit 104 perform an operation for raising the potential levels of the first voltage OUTB and the second voltage OUT, the operation thereof is the charge operation period.

In the charge operation period, the potential levels of the first voltage OUTB and the second voltage OUT smoothly increase within a predetermined power level variation width by first and second load capacitors LOAD_CAP1 and LOAD_CAP2, although the output end OUT_ND1 of the first voltage output unit 102 and the output end OUT_ND2 of the second voltage output unit 104 are directly connected to a power voltage end VDD. And, the first and second load capacitors respectively connected to the output end OUT_ND1 of the first voltage output unit 102 and the output unit OUT_ND2 of the second voltage output unit 104.

Here, the main clock CLOCK_PC and the sub clock CLOCKB_PC cannot influence the increment of the potential levels of the first and second voltage OUTB and OUT although the logical levels of the main clock CLOCK_PC and the sub clock CLOCKB_PC are changed. In the charge operation period of the first and second voltage output units 102 and 104, the potential levels of the first and second voltages OUTB and OUT increase as much as a predetermined potential level regardless of the logical levels of the main clock CLOCK_PC and the sub clock CLOCKB_PC.

And, the potential levels of the first and second voltages OUTB and OUT decrease because the first and second strobe PMOS transistor ST_P1 and ST_P2 are turned off and the strobe NMOS transistor ST_N is turned on when the strobe signal STROBE is activated to logical high. Here, the first and second strobe PMOS transistor ST_P1 and ST_P2 directly control applying power to an output end OUT_ND1 of the first voltage output unit 102 and an output end OUT_ND2 of the second voltage output unit 104. The strobe NMOS transistor ST_N controls power discharge. That is, it is the discharge operation period because the first and second voltage output units 102 and 104 perform operations for decreasing the potential levels of the first and second voltages OUTB and OUT.

In the discharge operation period, the potential levels of the first and second voltages OUTB and OUT gradually decrease with a predetermined potential level variation width by the first and second load capacitors LOAD_CAP1 and LOAD_CAP2 connected to the output end OUT_ND1 of the first voltage output unit 102 and the output end OUT_ND2 of the second voltage output unit 104 although the output end OUT_ND1 of the first voltage output unit 102 and the output end OUT_ND2 of the second voltage output unit 104 are directly connected a ground voltage end VSS.

Here, a time of decreasing the potential levels of the first and second voltages OUTB and OUT is changed according to logical level variation of the main clock CLOCK_PC and the sub clock CLOCKB_PC.

In more detail, if the main clock CLOCK_PC is activated to logical high, the potential level of the first voltage OUTB outputted from the first voltage output unit 120 decreases. If the main clock CLOCK_PC is inactivated to logical low, the potential level of the first voltage OUTB outputted from the first voltage output unit 102 does not decrease if the main clock CLOCK_PC is inactivated to logical low.

If the sub clock CLOCKB_PC is active, at a logical high, the potential level of the second voltage OUT output from the second voltage output unit 104 decreases. If the sub clock CLOCKB_PC is inactive, at a logical low, the potential level of the second voltage OUT output from the second voltage output unit 104 does not decrease.

In a period where the logical level of the strobe signal STROBE is inactive, at a logical low, the potential level of the first voltage OUTB and the potential level of the second voltage OUT increase as much as the same level. However, a period where the logical level of the strobe signal STROBE is active, at a logical high, the potential level of the first voltage OUTB gradually decreases corresponding to the activation period of the main clock CLOCK_PC and the potential level of the second voltage OUT also gradually decreases corresponding to the activation period of the sub clock CLOCKB_PC. Therefore, the potential level of the first voltage OUTB and the potential level of the second voltage OUT decrease as much as different potential levels.

Here, if the phase correction operation controller 140 repeats an inactivation period of the strobe signal STROBE where the strobe signal STROBE is inactivated to logical low at a predetermined interval by controlling the inactivation period of the strobe signal STROBE longer than an activation period thereof, a potential level of a voltage corresponding to one the main clock CLOCK_PC and the sub clock CLOCKB_PC having a longer activation period will decrease more. Therefore, it is possible to detect which between the main clock CLOCK_PC and the sub clock CLOCKB_PC has a longer activation period. In this way, it is possible to compare a phase of the main clock CLOCK_PC and a phase of a sub clock CLOCKB_PC.

Also, since the first voltage output unit 102 and the second voltage output unit 104 are formed in a cross-coupled formation, a potential level difference of the first and second voltages OUTB and OUT is not great due to an activation period difference of the main clock CLOCK_PC and the sub clock CLOCKB_PC when the logical level variation of the strobe signal STROBE repeats as many as initial regular times. However, if the potential level difference of the first and second voltages OUTB and OUT becomes larger than a predetermined level difference, the potential level is abruptly amplified, thereby reaching a potential level of the power source voltage VDD and a potential level of the ground voltage VSS.

That is, the first voltage OUTB has the same potential level of the ground voltage VSS and the second voltage OUT has the same level of the power source voltage VDD finally, even if the potential level of the second voltage OUT is slightly higher than the potential level of the first voltage OUTB when the logical level of the strobe signal STROBE varies for the initial predetermined times and when the activation period of the main clock CLOCK_PC is longer than the activation period of the sub clock CLOCKB_PC. Finally,.

Similarly, the potential level of the second voltage OUT becomes the same potential level of the ground voltage VSS and the level of the first voltage OUTB becomes the same level of the power source voltage VDD finally, even if the potential level of the first voltage OUTB is slightly higher than the potential level of the second voltage OUT when the logical level of the strobe signal STROBE varies for the initial predetermined times and when the activation period of the sub clock CLOCKB_PC is longer than the activation period of the main clock CLOCK_PC.

The potential level comparator 106 activates or inactivates a phase detection signal UP/DOWN_SIG according to the potential level difference between the first voltage OUTB and the second voltage OUT and outputs the activated or the inactivated phase detection signal. Also, the potential level comparator 106 activates or inactivates a valid detection signal VALID_STROBE.

For example, the potential level comparator 106 activates and outputs the phase detection signal UP/DOWN_SIG when the potential level of the first voltage OUTB is greater than that of the second voltage OUT, indicating that the detected phase of the main clock CLOCK_PC is greater than that of the sub clock CLOCKB_PC. The potential level comparator 106 inactivates the phase detection signal UP/DOWN_SIG if the potential level of the first voltage OUTB is less than that of the second voltage OUT, indicating that the detected phase of the sub clock CLOCKB_PC is smaller than the phase of the main clock CLOCK_PC.

If a logical level, e.g., High or Low corresponding to the potential level of the first voltage OUTB is identical to a logical level corresponding to a potential level of the second voltage OUT when the potential levels of the first and second voltages OUTB and OUT are changed to a logical level based on a logical decision level at the same time, the potential level comparator 106 inactivates and outputs the valid detection signal VALID_STROBE. If the logical levels are different, the potential level comparator 106 activates and outputs the valid detection signal VALID_STROBE.

As described above, the phase detector 100 of the conventional phase correction circuit performs the phase detection operation by comparing the potential levels of the first voltage OUTB corresponding to an activation period of the main clock CLOCK_PC and the second voltage OUT corresponding to an activation period of the sub clock CLOCKB_PC.

Meanwhile, the phase detector 100 of the conventional phase correction circuit performs a phase detection operation in response to a strobe signal STROBE that is not synchronized with external clocks CLOCK and CLOKCB.

As the phase correction operation controller toggles and outputs the strobe signal STROBE at a regular interval, regardless of toggling of the external clocks CLOCK and CLOCKB, the phase detector 100 performs the phase detection operation by changing the potential levels of the first and second voltages OUTB and OUT in response to the toggled strobe signal from the phase correction operation controller 140.

The resulting potential levels of the first and second voltages OUTB and OUT are different because the potential level of the first voltage OUTB is changed corresponding to the activation period of the main clock CLOCK_PC and the potential level of the second voltage OUT is changed corresponding to the activation period of the sub clock CLOCKB_PC. An assumption is that if the phase of the main clock CLOCK_PC is different from the phase of the sub clock CLOCKB_PC, the length of the activation period of the main clock CLOCK_PC is different from the length of the activation period of the sub clock CLOCKB_PC.

However, the phase detector 100 of the phase correction circuit according to the related art may have the following problems if the operation of the phase detector 100 is controlled as described above.

FIG. 3 is a timing diagram illustrating the operation of a phase detector of a phase correction circuit shown in FIG. 1.

Referring to FIG. 3, the timing diagram clearly shows that the strobe signal STROBE has a frequency lower than those of the main clock CLOCK_PC and the sub clock CLOCKB_PC applied to the phase detector 100.

That is, during a period that the strobe signal is toggled one time, the main clock CLOCK_PC and the sub clock CLOCKB_PC are toggled many times.

Here, the phase detector 100 of the conventional phase correction circuit cannot be aware of a transition time of the strobe signal because the strobe signal STROBE is a clock not synchronized with the external clocks CLOCK and CLOCKB which are clocks synchronized with the main clock CLOCK_PC and the sub clock CLOCKB_PC.

As shown in the first case, the strobe signal STROBE is activated before the main clock CLOCK_PC is inactivated after the main clock CLOCK_PC is activated and before the sub clock CLOCKB_PC is activated after the sub clock CLOCKB_PC is inactivated. After the strobe signal STROBE is activated, the strobe signal STROBE may be inactivated before the main clock CLOCK_PC is activate after the main clock CLOCK_PC is inactivated and before sub clock CLOCKB_PC is activated after the sub clock CLOCKB_PC is inactivated.

As shown in the second case, the strobe signal STROBE is activated before the main clock CLOCK_PC is activated after the main clock CLOCK_PC is inactivated and before the sub clock CLOCKB_PC is inactivated after the sub clock CLOCKB_PC is activated. After the strobe signal STROBE is activated, the strobe signal STROBE is inactivated before the main clock CLOCK_PC Is activated after the main clock CLOCK_PC is inactivated and before the sub clock CLOCKB_PC is activated after the sub clock CLOCKB_PC is inactivated.

If the activation periods of the strobe signal STROBE are setup like the first and second cases of the timing diagram, the periods of sustaining the active state of the main clock CLOCK_PC are smaller than the periods of sustaining the active state of the sub clock CLOCKB_PC in number in the first case.

In the second case, the periods of sustaining an active state of the main clock CLOCK_PC is larger than the periods of sustaining an active state of the sub clock CLOCKB_PC in number.

Thus, if the number of the periods of sustaining the active state of the main clock CLOCK_PC and the number of the periods of sustaining the inactive state of the sub clock CLOCKB_PC are changed because the activation periods of the strobe signal STROBE are wrongly defined, the phase detector 100 of the phase correction circuit according to the related art wrongly recognizes that a length of an activation period of one clock is longer than the other regardless of the actual lengths of the activation periods of the main clock CLOCK_PC and the sub clock CLOCKB_PC, thereby outputting an incorrect phase detection operation result.

Such a problem may frequently arise when the phase difference between the main clock CLOCK_PC and the sub clock CLOCKB_PC, which are applied to the phase detector 100 of the conventional phase correction circuit, is comparatively small.

Also, the problem may frequently arise when the frequency of the main clock CLOCK_PC and the sub clock CLOCKB_PC, which are applied to the phase detector 100 of the phase correction circuit according to the related art, is high.

Since the phase detection operation is the major operation of the phase correction circuit, a correct phase correction operation cannot be expected if the phase detection operation returns a wrong result. Also, if an internal circuit of a semiconductor device performs a predetermined operation using the wrong phase detection result, it is also difficult to expect that the semiconductor device returns an accurate and correct result.

SUMMARY OF THE INVENTION

Embodiments of the present invention are directed to providing a phase detector circuit of a semiconductor device for improving a phase detection ability by synchronizing a phase detection operation with an external clock.

In accordance with an aspect of the present invention, there is provided a semiconductor device which includes an edge synchronizer which outputs a synchronized strobe signal generated by synchronizing a transition time point of a strobe signal with clock edges of a main clock or a sub clock, a phase detector which outputs a phase determination signal indicating a phase difference between the main clock and the sub clock in response the synchronized strobe signal, and a duty ratio corrector which adjusts a duty ratio of the main clock and the sub clock in response to the phase determination signal.

BRIEF DESCRIPTION OF THE DRAWINGS

FIG. 7A and 7B are timing diagrams comparing an output signal of a phase detector of a phase correction circuit according to the related art shown in FIG. 1 with an output signal of a phase detector of a phase correction circuit according to an embodiment of the present invention shown in FIG. 4.

DESCRIPTION OF SPECIFIC EMBODIMENTS

Hereinafter, a register controlled DLL circuit in accordance with exemplary embodiments of the present invention will be described in detail with reference to the accompanying drawings.

Figure 4:
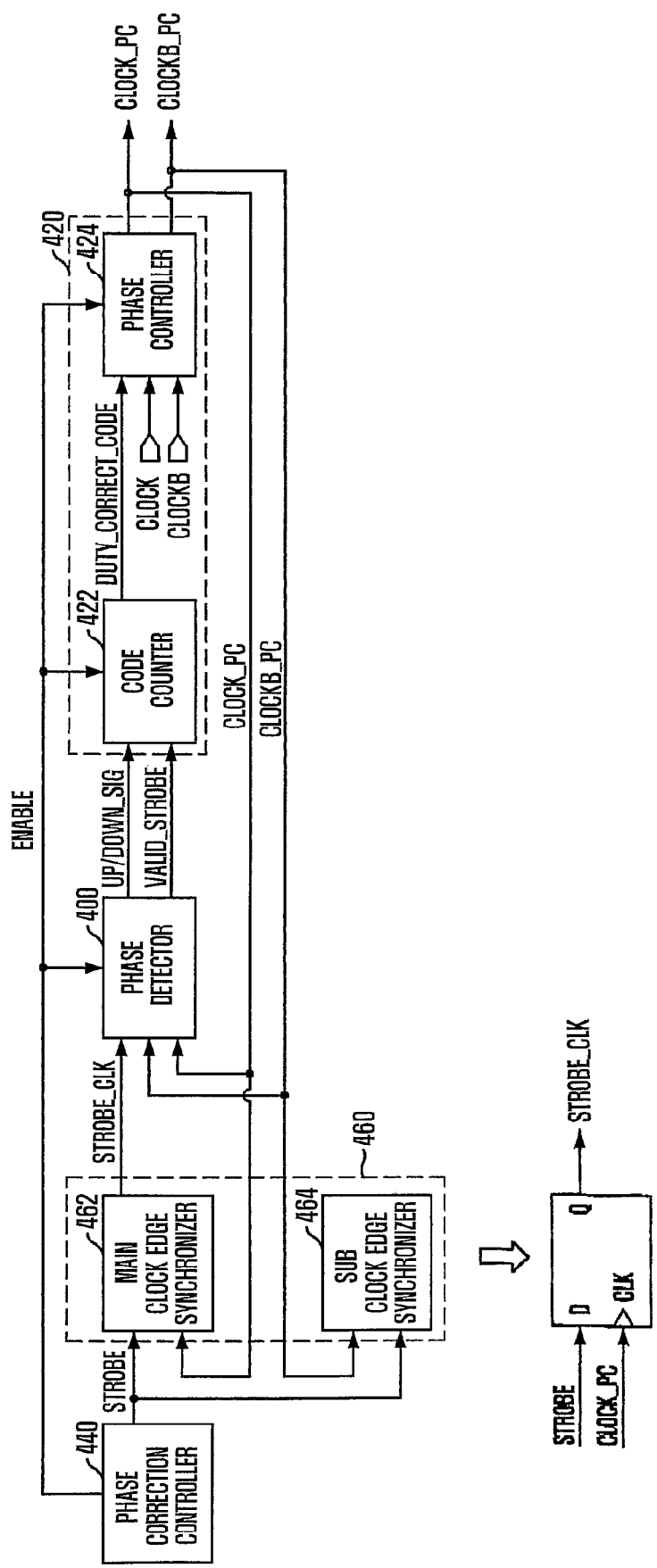
FIG. 4 is a block diagram of a phase correction circuit of a semiconductor device in accordance with an embodiment of the present invention.

FIG. 4 is a block diagram of a phase correction circuit of a semiconductor device in accordance with an embodiment of the present invention.

Referring to FIG. 4, the phase correction circuit according to the present embodiment includes an edge synchronizer 460 for synchronizing a transition time of a strobe signal STROBE with a clock edge of a main clock CLOCK_PC or a sub clock CLOCKB_PC, a phase detector for detecting a phase difference of the main clock CLOCK_PC and the sub clock CLOCKB_PC in response to an output signal STROBE_CLK of the edge synchronizer 460, and a compensator for correcting a duty ratio of the main clock CLOCK_PC and the sub clock CLOCKB_PC in response to an output signal UP/DOWN_SIG and VALID_STROBE of the phase detector 400. The phase correction circuit according to the present embodiment further includes a phase correction operation controller 440 for controlling a phase correction operation by generating a strobe signal STROBE for controlling the phase detection operation of the phase detector and an enable signal ENABLE for controlling ON/OFF of the phase detector 400 and the duty ratio corrector 420.

The duty ratio corrector 420 includes a code counter 422 for increasing or decoding a duty correction code DUTY_CORRECT_CODE in response to the output signal UP/DOWN_SIG and VALID_STROBE of the phase detector 400, and a phase controller 424 for controlling phases of the main clock CLOCK_PC and the sub clock CLOCKB_PC in response to the duty correction code DUTY_CORRECT_CODE.

The edge synchronizer 460 includes a main clock edge synchronizer 462 for synchronizing the clock edge of the main clock CLOCK_PC with a transition point of the strobe signal STROBE and a sub clock edge synchronizer 464 for synchronizing a clock edge of the sub clock CLOCKB_PC with a transition point of the strobe STORBE. And, the edge synchronizer 460 may include a flip flop for receiving the strobe signal through a data input end, receiving the main clock through a clock input end, and outputting the synchronized strobe signal through an output end. And, the edge synchronizer 460 may include a flip flop for receiving the strobe signal through a data input end, receiving the sub clock through a clock input end, and outputting the synchronized strobe signal through an output end.

Here, one of the synchronized strobe signals outputted from the main clock edge synchronizer 462 and the sub clock edge synchronizer 464 is used by the phase detector 400, while the other is not used. It is because only one of the main clock edge synchronizer 462 and the sub clock edge synchronizer 464 is used, while the other is a dummy element.

In fact, the one of the main clock edge synchronizer 462 and the sub clock edge synchronizer 464 which is the dummy element may be omitted.

For example, if the sub clock edge synchronizer 464 is a dummy element as shown in FIG. 4, the sub clock edge synchronizer 464 may be omitted.

The operation of the phase correction circuit according to the present embodiment will be described.

When the phase correction operation controller 440 activates the enable signal ENABLE, the phase detector 400 and the duty ratio corrector 420 are enabled to perform their respective operations.

In this condition, if the phase correction operation control 440 begins toggling the strobe signal STROBE at a regular interval, the edge synchronizer 460 generates a synch strobe signal STROBE_CLK having a toggling interval identical to the strobe signal STROBE and a transition time synchronized to a clock edge of the main clock CLOCK_PC or the sub clock CLOCKB_PC.

The synch strobe signal STROBE_CLK which is synchronized to the clock edge of the main clock CLOCK_PC or the sub clock CLOCKB_PC is applied to the phase detector 400, instead of the strobe signal STROBE, for controlling a phase detection signal for detecting a phase difference between the main clock CLOCK_PC and the sub clock CLOCKB_PC.

Like the conventional device, the phase detector 400 activates and outputs a phase detection signal UP/DOWN_SIG if the phase of the sub clock CLOCKB_PC is greater than that of the main clock CLOCK_PC. The phase detector 400 also inactivates and outputs a phase detection signal UP/DOWN_SIG if the phase of the main clock CLOCK_PC is greater than that of the sub clock CLOCKB_PC.

Like the conventional device, the phase detector 400 activates or inactivates and outputs a valid detection signal VALID_STROBE at the same time of outputting the phase detection signal UP/DOWN_SIG.

The valid detection signal VALID_STROBE denotes whether the phase detection signal UP/DOWN_SIG outputted from the phase detector 400 is valid or not.

That is, the phase detector 400 performs a phase detection operation in response to the synch strobe signal STROBE_CLK toggled at a regular interval. Whenever the synch strobe signal STROBE_CLK is toggled, the phase detector 400 performs the phase detection operation and outputs the result thereof. An accurate phase difference between the main clock CLOCK_PC and the sub clock CLOCKB_PC cannot be detected by toggling the synch strobe signal STROBE_CLK once. That is, an accurate phase difference between the main clock CLOCK_PC and the sub clock CLOCKB_PC can be detected by repeatedly toggling the synch strobe signal many times. Therefore, if a phase detection signal UP/DOWN_SIG output whenever the synch strobe signal STROBE_CLK is toggled is used as it is in the duty ratio corrector 420, it would not perform an accurate phase correction operation. Thus, the duty ratio corrector 420 uses the phase detection signal UP/DOWN_SIG when the valid detection signal VALID_STROBE is active by outputting the valid detection signal VALID_STROBE with the phase detection signal UP/DOWN_SIG, thereby performing the accurate phase correction operation.

The code counter 422, included in the duty ratio corrector 420, increases or decreases a duty correction code DUTY_CORRECT_CODE in response to a phase detection signal UP/DOWN_SIG when the valid detection signal VALID_STROBE is active.

For example, if the phase detection signal UP/DOWN_SIG is active and the valid detection signal VALID_STROBE is active, the code counter 422 increases and outputs the duty correction code DUTY_CORRECT_CODE, indicating that a detected phase of the main clock CLOCK_PC is greater than the phase of the sub clock CLOCKB_PC. If the phase detection signal UP/DOWN_SIG is inactive and the valid detection signal VALID_STROBE is active, the code counter 422 decreases and outputs the duty correction code DUTY_CORRECT_CODE, indicating that the detected phase of the main clock CLOCK_PC is less than the phase of the sub clock CLOCKB_PC.

A predetermined initial value for the duty correction code DUTY_CORRECT_CODE is defined in advance.

The phase controller 424 drives an external clock CLOCK and an external sub clock CLOCKB with a driving force corresponding to the duty correction code DUTY_CORRECT_CODE and outputs them as a main clock CLOCK_PC and a sub clock CLOCKB_PC.

For example, if the value of the duty correction code DUTY_CORRECT_CODE is comparatively large, the external main clock CLOCK is driven stronger than the external sub clock CLOCKB and the external main clock and the external sub clock are outputted as the main clock CLOCK and the sub clock CLOCKB_PC. If the duty correction code DUTY_CORRECT_CODE is comparatively small, the external sub clock CLOCKB is driven stronger than the external main clock CLOCK and the external sub clock CLOCKB and the external main clock CLOCK are outputted as the main clock CLOCK_PC and the sub clock CLOCKB_PC.

Although the main clock CLOCK_PC and the sub clock CLOCKB_PC output by the duty ratio corrector 420 are input and used in an internal circuit of a semiconductor device using the main clock CLOCK_PC and the sub clock CLOCKB_PC, they are inputted to the phase detector 400 again and used to perform the phase correction operation.

The phase difference between the external main clock CLOCK and the external sub clock CLOCKB is not accurately corrected through only one phase correction operation. The main clock CLOCK_PC and the sub clock CLOCKB_PC with an accurately corrected phase difference can be output through repeat phase correction operation.

Figure 1:
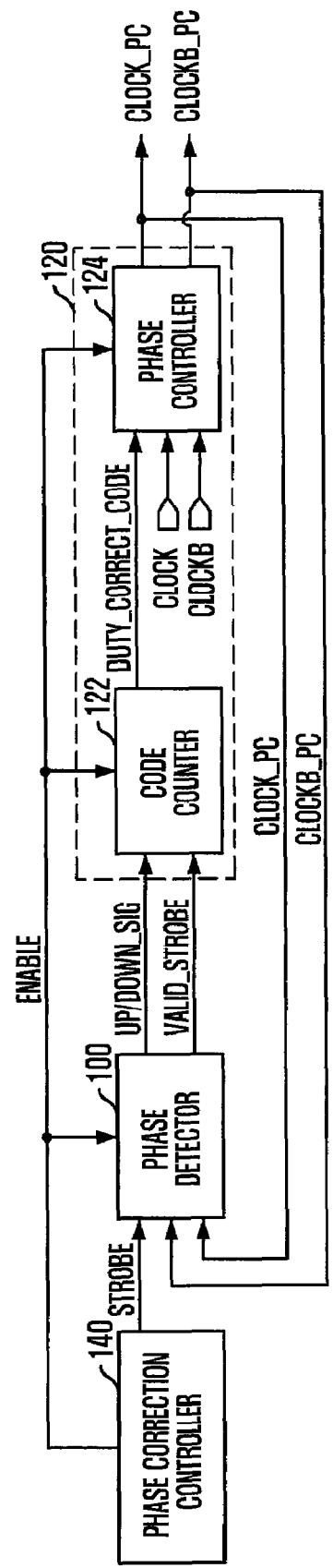
FIG. 1 is a diagram showing a conventional phase correction circuit.

In conclusion, the phase correction circuit according to the embodiment illustrated in FIG. 4 uses the synch strobe signal STROBE_CLK, which is synchronized with an external clock as a signal for controlling a phase detection operation, unlike the phase conventional correction circuit shown in FIG. 1 which uses the strobe signal STROBE which is not synchronized with the external clock CLOCK or CLOCKB.

Figure 5:
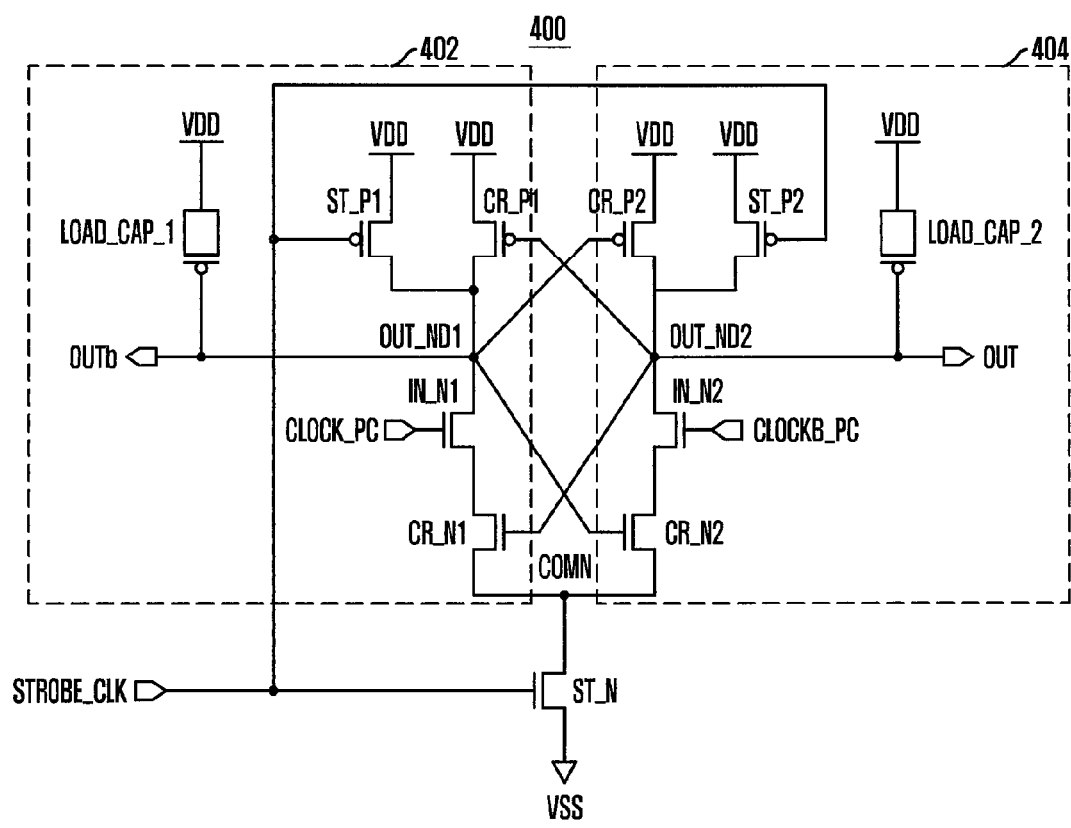
FIG. 5 is a circuit diagram illustrating a phase detector of a phase correction circuit in accordance with an embodiment of the present invention shown in FIG. 4.
Figure 5:
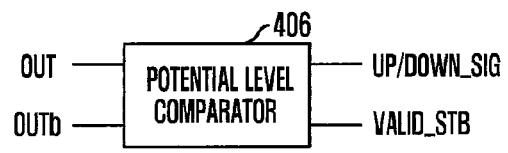

FIG. 5 is a circuit diagram illustrating a phase detector of a phase correction circuit in accordance with an embodiment of the present invention shown in FIG. 4.

Referring to FIG. 5, phase detector 400 includes a first voltage output unit 402 for outputting a first voltage OUTB having a potential level varying corresponding to a duty ratio of the main clock CLOCK_PC, a second voltage output unit 404 for outputting a second voltage OUT having a potential level corresponding a duty ratio of the sub clock CLOCKB_PC, and a potential level comparator 406 for comparing a potential level of the first voltage OUTB with that of the second voltage OUT and generating a phase detection signal UP/DOWN_SIG and a valid detection signal VALID_STROBE according to the comparison result.

Hereinafter, the operation of the phase detector 400 will be described with reference to the above described structure thereof.

Figure 2:
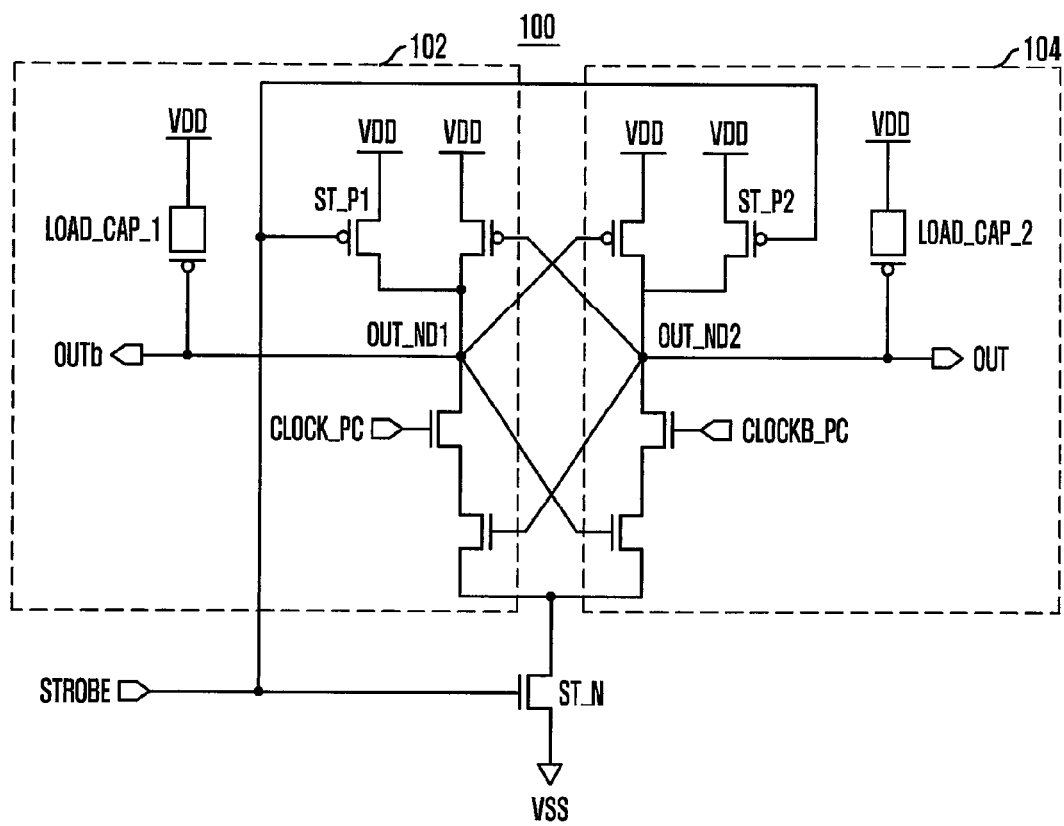
FIG. 2 is a circuit diagram showing a phase detector included in a conventional phase correction circuit of FIG. 1.
Figure 2:
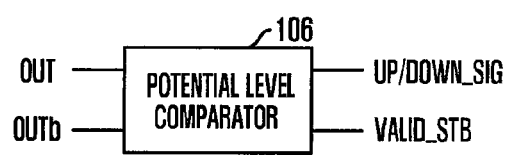

The operation of the first voltage output unit 402 and the second voltage output unit 404 can be divided into a charge operation period and a discharge operation period according to the synch strobe signal STROBE_CLK, similar to the operation of phase detector according to the conventional device shown in FIG. 2 with respect to strobe signal STROBE.

That is, the potential levels of the first voltage OUTB and the second voltage OUT increase because first and second strobe PMOS transistor ST_P1 and ST_P2 are turned on and a strobe NMOS transistor ST_N is turned off when the synch strobe signal STROBE_CLK is inactive, at a logical low. Here, the first and second strobe PMOS transistors ST_P1 and ST_P2 respectively control applying power to an output end OUT_ND1 of the first voltage output unit 402 and an output end OUT_ND2 of the second voltage output unit 404. The strobe NMOS transistor ST_N directly controls power discharge. That is, since the first voltage output unit 402 and the second voltage output unit 404 perform an operation for raising the potential levels of the first voltage OUTB and the second voltage OUT, it is the charge operation period.

In the charge operation period, the potential levels of the first voltage OUTB and the second voltage OUT smoothly increase within a predetermined power level variation width by first and second load capacitors LOAD_CAP1 and LOAD_CAP2 respectively connected to the output end OUT_ND1 of the first voltage output unit 402 and the output unit OUT_ND2 of the second voltage output unit 404, although the output end OUT_ND1 of the first voltage output unit 402 and the output end OUT_ND2 of the second voltage output unit 404 are directly connected to a power voltage end VDD.

Here, the main clock CLOCK_PC and the sub clock CLOCKB_PC cannot influence the increment of the potential levels of the first and second voltage OUTB and OUT although the logical levels of the main clock CLOCK_PC and the sub clock CLOCKB_PC are changed. In the charge operation period of the first and second voltage output units 402 and 404, the potential levels of the first and second voltages OUTB and OUT increase as much as a predetermined potential level regardless of the logical levels of the main clock CLOCK_PC and the sub clock CLOCKB_PC.

And, the potential levels of the first and second voltages OUTB and OUT decrease because the first and second strobe PMOS transistor ST_P1 and ST_P2 are turned off and the strobe NMOS transistor ST_N is turned on when the synch strobe signal STROBE_CLK is activated to logical high. Here, the first and second strobe PMOS transistor ST_P1 and ST_P2 directly control applying power to an output end OUT_ND1 of the first voltage output unit 402 and an output end OUT_ND2 of the second voltage output unit 404. The strobe NMOS transistor ST_N controls power discharge. That is, it is the discharge operation period because the first and second voltage output units 402 and 404 perform operations for decreasing the potential levels of the first and second voltages OUTB and OUT.

In the discharge operation period, the potential levels of the first and second voltages OUTB and OUT gradually decrease with a predetermined potential level variation width by the first and second load capacitors LOAD_CAP1 and LOAD_CAP2 connected to the output end OUT_ND1 of the first voltage output unit 402 and the output end OUT_ND2 of the second voltage output unit 404 although the output end OUT_ND1 of the first voltage output unit 402 and the output end OUT_ND2 of the second voltage output unit 404 are directly connected a ground voltage end VSS.

Here, a time of decreasing the potential levels of the first and second voltages OUTB and OUT is changed according to logical level variation of the main clock CLOCK_PC and the sub clock CLOCKB_PC.

In more detail, if the main clock CLOCK_PC is active, at a logical high, the potential level of the first voltage OUTB output from the first voltage output unit 402 decreases. If the main clock CLOCK_PC is inactive, at a logical low, the potential level of the first voltage OUTB output from the first voltage output unit 402 does not decrease if the main clock CLOCK_PC is inactivated to logical low.

If the sub clock CLOCKB_PC is active, at a logical high, the potential level of the second voltage OUT output from the second voltage output unit 404 decreases. If the sub clock CLOCKB_PC is inactive, at a logical low, the potential level of the second voltage OUT output from the second voltage output unit 404 does not decrease.

In a period where the logical level of the synch strobe signal STROBE_CLK is inactive, at a logical low, the potential level of the first voltage OUTB and the potential level of the second voltage OUT increase as much as the same level. However, a period where the logical level of the synch strobe signal STROBE_CLK is active, at a logical high, the potential level of the first voltage OUTB gradually decreases corresponding to the activation period of the main clock CLOCK_PC and the potential level of the second voltage OUT also gradually decreases corresponding to the activation period of the sub clock CLOCKB_PC. Therefore, the potential level of the first voltage OUTB and the potential level of the second voltage OUT decrease as much as different potential levels.

Here, if the phase correction operation controller 440 repeats an inactivation period of the strobe signal STROBE where the strobe signal STROBE is inactivated to logical low at a predetermined interval by controlling the inactivation period of the strobe signal STROBE longer than an activation period thereof, the logical level of the synch strobe signal STROBE_CLK is accordingly controlled to have an inactivation period longer than an activation period. As the operation of the phase detector 400 is controlled through such a synch strobe signal STROBE_CLK, a potential level of a voltage corresponding to one the main clock CLOCK_PC and the sub clock CLOCKB_PC having a longer activation period will decrease more. Therefore, it is possible to detect which between the main clock CLOCK_PC and the sub clock CLOCKB_PC has a longer activation period. In this way, it is possible to compare a phase of the main clock CLOCK_PC and a phase of a sub clock CLOCKB_PC.

The synch strobe signal STROBE_CLK applied to the phase detector 400 is a signal having a transition time synchronized with a clock edge of the main clock CLOCK_PC or the sub clock CLOCKB_PC, the beginning and ending of the charge operation period is synchronized with a clock edge of the main clock CLOCK_PC or the sub clock CLOCKB_PC, and the toggling times of the main clock CLOCK_PC and the toggling times of the sub clock CLOCKB_PC are the same in the charge operation period.

Similarly, the beginning and ending of the charge operation period is synchronized with a clock edge of the main clock CLOCK_PC or the sub clock CLOCKB_PC, and the toggling times of the main clock CLOCK_PC and the toggling times of the sub clock CLOCKB_PC are the same in the charge operation period.

That is, the number of periods that sustain the active state of the main clock CLOCK_PC and the number of periods that sustain the active state of the sub clock CLOCKB_PC are always the same in the charge operation period and the discharge operation period, because the toggling times of the main clock CLOCK_PC and the toggling times of the sub clock CLOCKB_PC are the same in the charge/discharge operation period.

Therefore, it is possible to prevent the problem with the conventional art that wrongly recognizes that a length of an activation period of one clock is longer than the other regardless of the actual lengths of the activation periods of the main clock CLOCK_PC and the sub clock CLOCKB_PC. And the problem with the conventional art occurs when the number of the periods of sustaining the active state of the main clock CLOCK_PC and the number of the periods of sustaining the inactive state of the sub clock CLOCKB_PC are changed by wrong defining the activation periods of the strobe signal STROBE are wrongly defined Since the first voltage output unit 402 and the second voltage output unit 404 are formed in a cross-coupled formation, a potential level difference of the first and second voltages OUTB and OUT is not great due to an activation period difference of the main clock CLOCK_PC and the sub clock CLOCKB_PC when the logical level variation of the synch strobe signal STROBE_CLK repeats as many as initial regular times. However, if the potential level difference of the first and second voltages OUTB and OUT becomes larger than a predetermined level difference, the potential level is abruptly amplified, thereby reaching a potential level of the power source voltage VDD and a potential level of the ground voltage VSS.

That is, the first voltage OUTB has the same potential level of the ground voltage VSS and the second voltage OUT has the same level of the power source voltage VDD finally, even if the potential level of the second voltage OUT is slightly higher than the potential level of the first voltage OUTB when the logical level of the synch strobe signal STROBE_CLK varies for the initial predetermined times and when the activation period of the main clock CLOCK_PC is longer than the activation period of the sub clock CLOCKB_PC.

Similarly, the potential level of the second voltage OUT becomes the same potential level of the ground voltage VSS and the level of the first voltage OUTB becomes the same level of the power source voltage VDD finally, even if the potential level of the first voltage OUTB is slightly higher than the potential level of the second voltage OUT when the logical level of the synch strobe signal STROBE_CLK varies for the initial predetermined times and when the activation period of the sub clock CLOCKB_PC is longer than the activation period of the main clock CLOCK_PC.

The potential level comparator 406 activates or inactivates a phase detection signal UP/DOWN_SIG according to the potential level difference between the first voltage OUTB and the second voltage OUT and outputs the activated or the inactivated phase detection signal. Also, the potential level comparator 106 activates or inactivates a valid detection signal VALID_STROBE.

For example, the potential level comparator 406 activates and outputs the phase detection signal UP/DOWN_SIG when the potential level of the first voltage OUTB is greater than that of the second voltage OUT, indicating that the detected phase of the main clock CLOCK_PC is greater than that of the sub clock CLOCKB_PC. The potential level comparator 106 inactivates the phase detection signal UP/DOWN_SIG if the potential level of the first voltage OUTB is less than that of the second voltage OUT, indicating that the detected phase of the sub clock CLOCKB_PC is smaller than the phase of the main clock CLOCK_PC.

If a logical level, e.g., High or Low corresponding to the potential level of the first voltage OUTB is identical to a logical level corresponding to a potential level of the second voltage OUT when the potential levels of the first and second voltages OUTB and OUT are changed to a logical level based on a logical decision level at the same time, the potential level comparator 106 inactivates and outputs the valid detection signal VALID_STROBE. If the logical levels are different, the potential level comparator 106 activates and outputs the valid detection signal VALID_STROBE.

As described above, the phase detector 400 performs the phase detection operation by comparing the potential levels of the first voltage OUTB corresponding to an activation period of the main clock CLOCK_PC and the second voltage OUT corresponding to an activation period of the sub clock CLOCKB_PC.

Since the signal STROBE_CLK for controlling a phase detection operation is synchronized with the main clock CLOCK_PC or the sub clock CLOCKB_PC, the phase detection operation is performed by measuring the activation period of the main clock CLOCK_PC with the sub clock CLOCKB_PC within a minimum error range.

Figure 3:
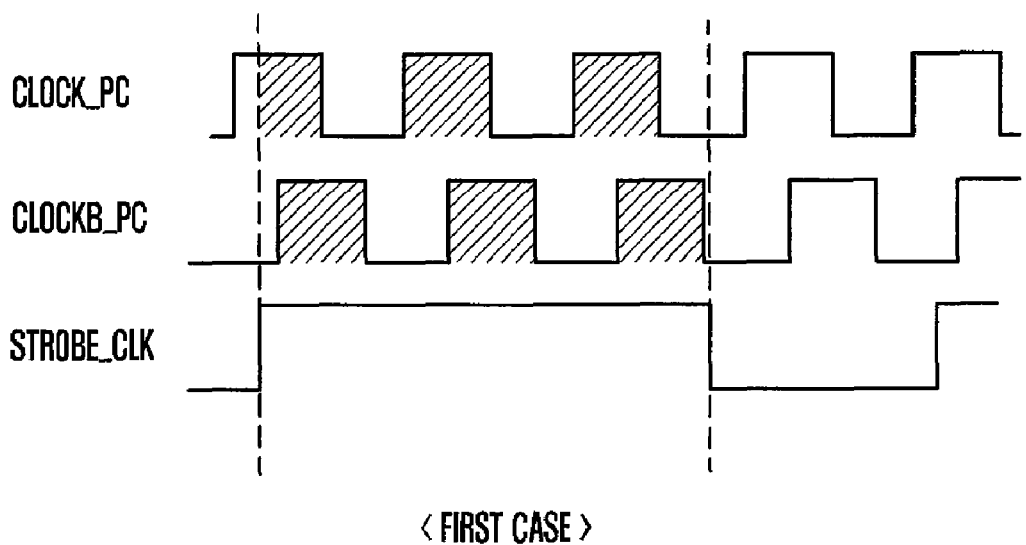
FIG. 3 is a timing diagram illustrating the operation of a phase detector of a phase correction circuit shown in FIG. 1.
Figure 3:
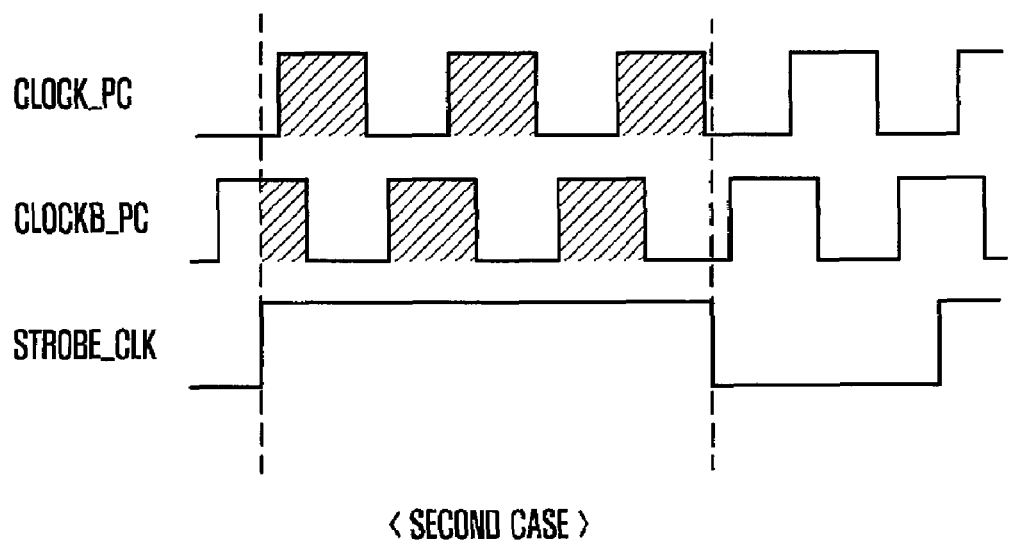
Figure 6:
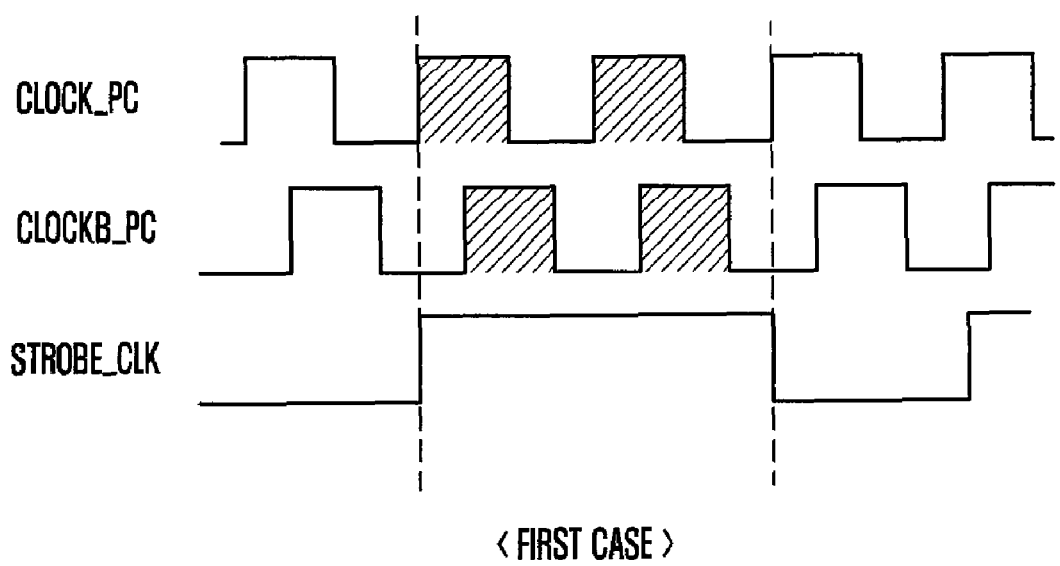
FIG. 6 is a timing diagram illustrating the operation of a phase detector of a phase correction circuit shown in FIG. 3.
Figure 6:
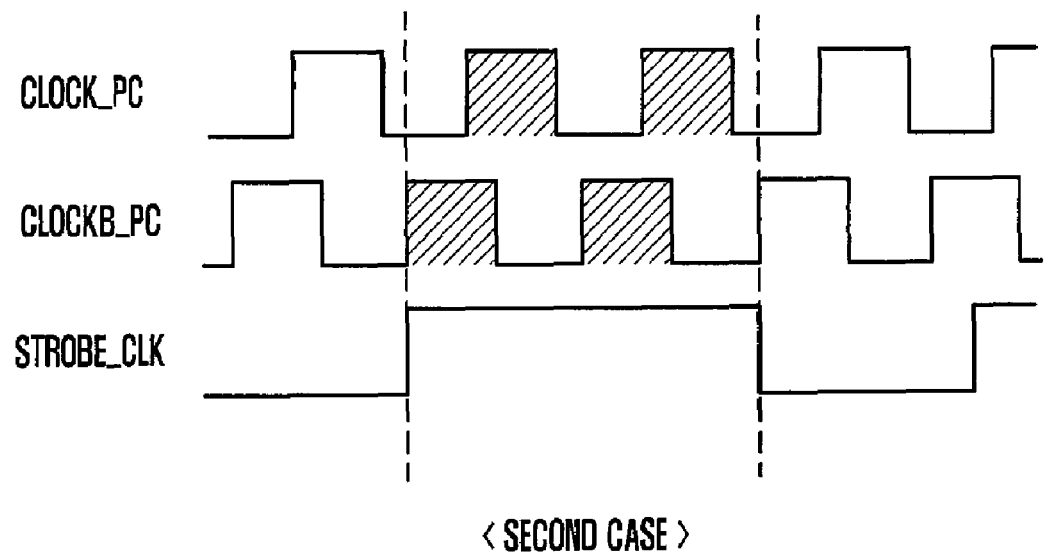

FIG. 6 is a timing diagram illustrating the operation of a phase detector of a phase correction circuit shown in FIG. 3.

Referring to FIG. 6, the timing diagram clearly shows that the synch strobe signal STROBE_CLK has a frequency lower than those of the main clock CLOCK_PC and the sub clock CLOCKB_PC applied to the phase detector 400.

That is, during a period that the synch strobe signal STROBE_CLK is toggled one time, the main clock CLOCK_PC and the sub clock CLOCKB_PC are toggled many times.

Here, the phase detector 400 is aware that the transition time point of the synch strobe signal STROBE_CLK is synchronized with a clock edge, e.g., a rising edge of the main clock CLOCK_PC or the sub clock CLOCKB_PC, whereby the synch strobe signal STROBE_CLK is a clock synchronized with an external clocks CLOCK or CLOCKB which are clocks synchronized with the main clock CLOCK_PC and the sub clock CLOCB_PC.

As shown in the first case, the synch strobe signal STROBE_CLK is activated when the main clock CLOCK_PC is activated and before the sub clock CLOCKB_PC is activated after the sub clock CLOCKB_PC is inactivated. After the synch strobe signal STROBE_CLK is activated, the synch strobe signal STROBE_CLK may be inactivated when the main clock CLOCK_PC is activated and before sub clock CLOCKB_PC is activated after the sub clock CLOCKB_PC is inactivated.

As shown in the second case, the synch strobe signal STROBE_CLK is activated before the main clock CLOCK_PC is activated after the main clock CLOCK_PC is inactivated and when the sub clock CLOCKB_PC is activated. After the synch strobe signal STROBE_CLK is activated, the synch strobe signal STROBE_CLK is inactivated before the main clock CLOCK_PC is activated after the main clock CLOCK_PC is inactivated and when the sub clock CLOCKB_PC is activated.

The number of periods that sustain the active state of the main clock CLOCK_PC always is identical to the number of periods that sustain the active state of the sub clock CLOCKB_PC when the activation periods of the synch strobe signal STROBE_CLK are synchronized with the main clock CLOCK_PC or the sub clock CLOCKB_PC such as in the first and second cases of the timing diagram, for example, when the activation period of the synch strobe signal STROBE_CLK is defined based on the activation time of the main clock CLOCK_PC like the first case or when the activation period of the synch strobe signal STROBE_CLK is defined based on the activation time of the sub clock CLOCKB_PC like the second case, FIGS. 7A and 7B are timing diagrams comparing an output signal of a phase detector of a conventional phase correction circuit shown in FIG. 1 with an output signal of a phase detector of a phase correction circuit according to an embodiment of the present invention illustrated in FIG. 4.

Referring to FIG. 7A, a first drawing shows the output signal UP/DOWN_SIG of the phase detector 100 of the conventional phase correction circuit shown in FIG. 1. In the first drawing, the output signal UP/DOWN_SIG of the phase detector 100 is not stably fixed to one value and irregularly varies between the active state and the inactive state until the phase difference between the main clock CLOCK_PC and the sub clock CLOCKB_PC applied to the phase detector 100 exceeds 10 ps.

That is, the result value of the phase detection signal UP/DOWN_SIG disadvantageously varies by the strobe signal until the phase difference of the main clock CLOCK_PC and the sub clock CLOCKB_PC becomes large enough.

FIG. 7B shows the output signal of the phase detector 400 of the phase correction circuit according to the present embodiment. In FIG. 7B, the output signal UP/DOWN_SIG of the phase detector 400 is accurately fixed to one value after the phase difference between the main clock CLOCK_PC and the sub clock CLOCKB_PC exceeds 2 ps.

That is, since the synch strobe signal STROBE_CLK is synchronized with the clock edge of the main clock CLOCK_PC or the sub clock CLOCKB_PC, the operation of the phase detector 400 is not influenced by phase of the synch strobe signal STROBE_CLK. Therefore, the phase difference between the main clock CLOCK_PC and the sub clock CLOCKB_PC can be accurately detected.

As discussed above, an embodiment of the present invention can prevent an inaccurate phase detection operation from occurring due to the strobe signal STROBE by synchronizing a synch strobe signal STROBE_CLK for controlling a phase detection operation with clocks CLOCK_PC and CLOCKB_PC for comparing phases and applying the synch strobe signal STROBE_CLK to the phase detector circuit.

That is, it is possible to prevent error from generating in a result value of the phase detector circuit due to the influence of the strobe signal STROBE.

Therefore, the phase detection ability of the phase detector circuit of a semiconductor element can be improved.

While the present invention has been described with respect to the specific embodiments, it will be apparent to those skilled in the art that various changes and modifications may be made without departing from the spirit and scope of the invention as defined in the following claims.

As a nonlimiting example, locations and types of logical gates and transistors in the aforesaid embodiment of the present invention may be different from that illustrated in the drawings according to the polarities of input signals.

What is claimed is:

1. A semiconductor device comprising:
an edge synchronizer configured to receive a main clock or a sub clock and a strobe signal and output a synchronized strobe signal generated by synchronizing a transition time point of the strobe signal with a clock edge of the main clock or the sub clock;
a phase detector configured to output a phase determination signal indicating a phase difference between the main clock and the sub clock in response to the synchronized strobe signal; and
a duty ratio corrector configured to adjust a duty ratio of the main clock and the sub clock in response to the phase determination signal and output the main clock and the sub clock.

2. The semiconductor device of claim 1, wherein the edge synchronizer includes a flip flop configured to output the synchronized strobe signal in response to the strobe signal and the main clock.

3. The semiconductor device of claim 1, wherein the edge synchronizer includes a flip flop configured to output the synchronized strobe signal in response to the strobe signal and the sub clock.

4. The semiconductor device of claim 1, wherein the phase detector includes:
a first voltage generator which outputs a first voltage in response to the synchronized strobe signal and having a potential level varying corresponding to a duty ratio of the main clock;
a second voltage generator which outputs a second voltage in response to the synchronized strobe signal and having a potential level varying corresponding to a duty ratio of the sub clock; and
a comparator which outputs the phase determination signal based on the potential levels of the first and second voltages.

5. The semiconductor device of claim 4, wherein the first voltage generator increases the potential level of the first voltage during an activation period of the main clock in a charge operation period defined by the synchronized strobe signal.

6. The semiconductor device of claim 4, wherein the first voltage generator decreases the potential level of the first voltage during an inactivation period of the main clock in a discharge operation period defined by the synchronized strobe signal.

7. The semiconductor device of claim 4, wherein the second voltage generator increases the potential level of the second voltage during an activation period of the sub clock in a charge operation period defined by the synchronized strobe signal.

8. The semiconductor device of claim 4, wherein the second voltage generator decreases a potential level of the second voltage during an inactivation period of the sub clock in a discharge operation period defined by the synchronized strobe signal.

9. The semiconductor device of claim 4, wherein the phase detector outputs a validity signal in response to a potential level difference between the first and second voltages.

10. The semiconductor device of claim 9, wherein the duty ratio corrector comprises:
a code counter which increases or decreases a duty correction code in response to the validity signal and the phase determination signal; and
a phase controller which controls phases of the main clock and the sub clock in response to the duty correction code.

11. The semiconductor device of claim 10, wherein the code counter increases or decreases the duty correction code in response to in the phase determination signal during an activation period of the valid signal.

12. The semiconductor device of claim 10, wherein the code counter does not increase or decrease the duty correction code regardless of an output signal of the comparator in an inactivation period of the valid signal.

13. The semiconductor device of claim 1, wherein the duty ratio corrector includes:
a code counter which increases or decreases a duty correction code in response to the phase determination signal; and
a phase controller which controls phases of the main clock and the sub clock in response to the duty correction code.

* * * * *